(12) United States Patent
Ufert

(10) Patent No.: US 7,368,314 B2
(45) Date of Patent: May 6, 2008

(54) METHOD FOR FABRICATING A RESISTIVE MEMORY

(75) Inventor: Klaus-Dieter Ufert, Unterschleißheim (DE)

(73) Assignee: Infineon Technologies AG

( * ) Notice: Subject to any disclaimer, the term of this patent is extended or adjusted under 35 U.S.C. 154(b) by 93 days.

(21) Appl. No.: 11/344,533

(22) Filed: Feb. 1, 2006

(65) Prior Publication Data

US 2006/0199377 A1    Sep. 7, 2006

(30) Foreign Application Priority Data

Feb. 4, 2005   (DE) .................. 10 2005 005 325

(51) Int. Cl.
    *H01L 21/00* (2006.01)
(52) U.S. Cl. .................. 438/95; 257/E21.075
(58) Field of Classification Search .......... 438/95; 257/E21.073, E21.075
    See application file for complete search history.

(56) References Cited

U.S. PATENT DOCUMENTS

| 4,550,074 A | 10/1985 | Tzinis et al. |
| 6,365,510 B2 | 4/2002 | Schmidbauer et al. |
| 2003/0186504 A1 | 10/2003 | Li et al. |
| 2004/0014312 A1 | 1/2004 | Kunishima et al. |

FOREIGN PATENT DOCUMENTS

JP        63029504        2/1988

*Primary Examiner*—Lex Malsawma
(74) *Attorney, Agent, or Firm*—Dicke, Billig & Czaja, PLLC

(57) ABSTRACT

A method for fabricating a resistively switching memory cell is provided. The method includes the following steps: depositing a first electrode, applying a layer of a chalcogenide compound to the first electrode, applying a layer of silver or copper, and operating a noble gas plasma in a back-sputtering mode in order to effect silver or copper diffusion into the layer of the chalcogenide compound. Optionally, and if appropriate, further layers for the second electrode are then deposited.

20 Claims, 1 Drawing Sheet

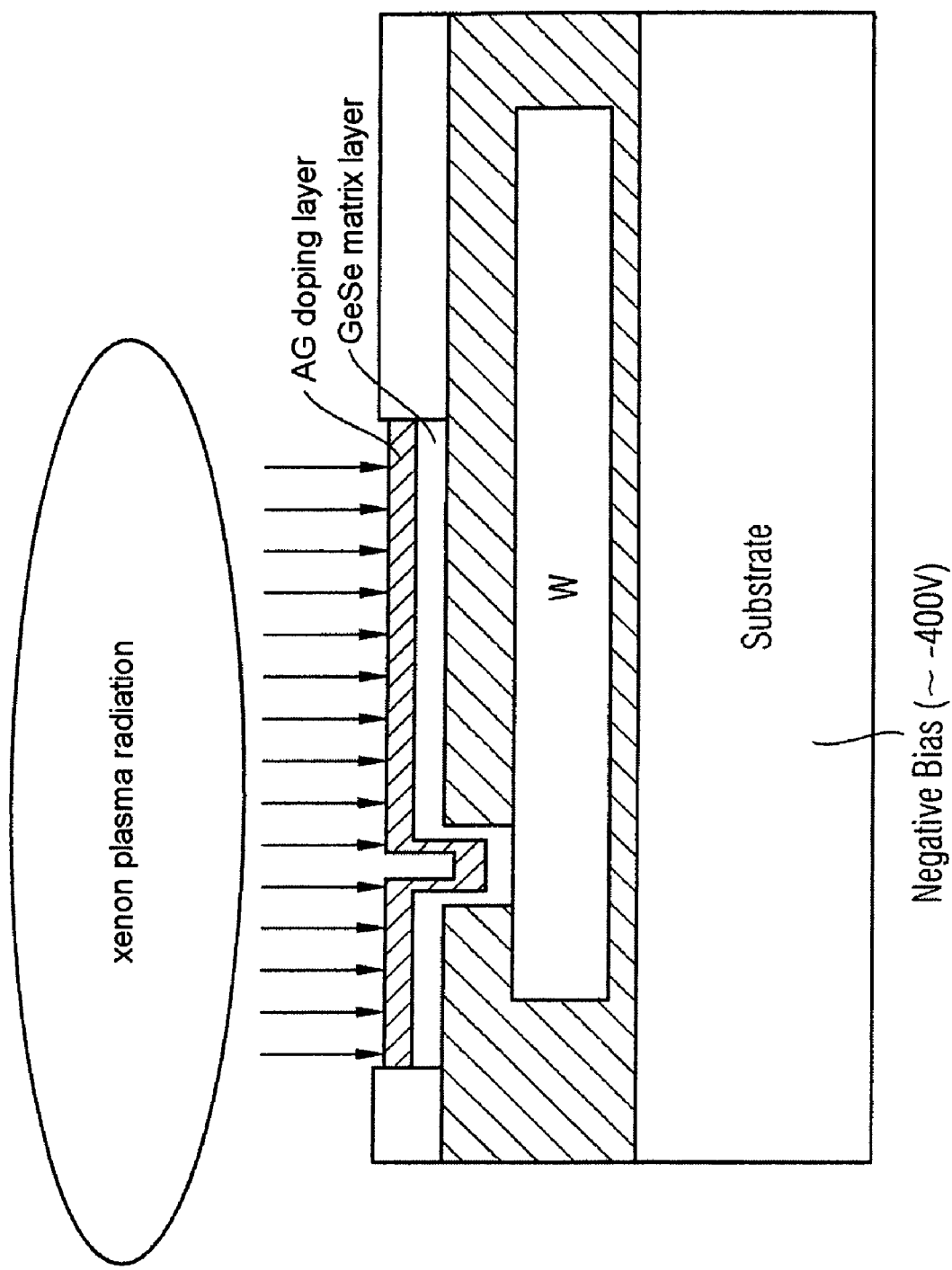

METHOD FOR FABRICATING A RESISTIVE MEMORY

CROSS REFERENCE TO RELATED APPLICATIONS

This application claims priority under 35 USC §119 to German Application No. DE10 2005 005 325.4, filed on Feb. 4, 2005, and titled "Method for Fabricating a Resistively Switching Nonvolatile Memory Cell," the entire contents of which are hereby incorporated by reference.

FIELD OF THE INVENTION

The present invention relates to nonvolatile, resistively switching memory cells.

BACKGROUND

Nonvolatile, resistively switching memory cells include a first electrode, a second electrode and a solid electrolyte that is contact-connected by the two electrodes in a sandwich-type geometry. The solid electrolyte includes an amorphous matrix of a chalcogenide compound and a metal which is distributed in the amorphous matrix and the cations of which migrate in the amorphous matrix to the cathode under the influence of an electric voltage. The memory cells, on account of the migration of these cations, are switchable by a first electric voltage into a state with a low electrical resistance and by a second electric voltage of opposite polarity into a state with a high electrical resistance.

These two physical states (i.e., the state with the high electrical resistance and the state with the low electrical resistance) are used for the storage of information. Usually, the higher electrical resistance is assigned to logic 0 and the lower electrical resistance is assigned to logic 1.

After the brief supply of current has been switched off, specifically both after programming (transition to the state with the low electrical resistance) and after erasing (transition to the state with the high electrical resistance) or reading of the information, the resistance value which was induced last is retained in stable form for a prolonged period of time. Accordingly, the storage of information in resistively switching memory cells is nonvolatile.

The strong increase in the conductivity of the resistively switching memory cell when a voltage is applied is based on electrochemical processes in the solid electrolyte of the memory cell, which leads to the formation of a metallic bridge that extends all the way from the cathode to the anode. Applying a voltage of opposite polarity at least partially removes this bridge again, and the metallically conductive path between the electrodes is interrupted: the memory cell returns to the state with the high resistance. On account of this storage mechanism, nonvolatile, resistively switching memory cells are also known as nonvolatile CBRAM (conductive bridging random access memory) memory cells. This form of memory cells is distinguished by a low switching voltage with short switching times. Furthermore, with this type of memory cells, a high number of switching cycles is achieved with a good thermal stability.

The memory cell designs which have been used hitherto (such as for example floating gate memories, such as flash or DRAM), on account of their mechanism being based on the storage of charges, will reach the limits of scalability within the foreseeable future. The problem with DRAM and flash memory cells is that with ongoing miniaturization of the memory cells, the charge quantity which can be held in a cell is also becoming ever smaller. However, as the charge quantity decreases, so too does the reliability of information storage. Memory cells which are based on capacitive charging no longer operate satisfactorily, on account of the lower voltages and current intensities caused by miniaturization in this "low-energy" range.

Furthermore, as in the case of the flash memory, the high switching voltages and the limited number of read and write cycles, and in the case of the DRAM the very limited duration of storage of the charge state, constitute additional problems which it has not hitherto been possible to solve in an optimum way. The problem of leakage currents within the storage capacitor which exists with the DRAM design, leading to the loss of charge, is currently resolved to only an unsatisfactory extent by constant refreshing of the stored charge.

These and other problems have led to new storage technologies, which are based on concepts other than capacitive charging, having been developed in recent years. In this context, the nonvolatile CBRAM memory cells mentioned above are very promising. These memory cells have been described, for example, in International Patent Application Publication Nos. WO 97/48032 and WO 03/032392, U.S. Pat. No. 6,418,049, and U.S. Patent Application Publication Nos. 2003/020997 and 2003/0209728.

The storage concept of CBRAM memory cells is not based on the storage of charges, but rather on the difference in resistance between two stable states, which is caused by a high mobility of metal ions in a matrix of chalcogenide compound(s) when an electric field is applied.

As noted above, CBRAM memory cells typically include two electrodes and a thin film of a solid electrolyte that is contact-connected by the two electrodes in a sandwich-type geometry. Solid electrolytes may be crystalline or amorphous solids. The solid electrolytes used in CBRAM cells typically include amorphous solids, which can also be referred to as amorphous matrix or glasses. The solid electrolytes are preferably chalcogenide compounds.

Chalcogenides are compounds in which one or more elements of main group VI of the Periodic System (oxygen, sulfur, selenium, tellurium) form the more electronegative compound, which are referred to as oxides, sulfides, selenides and tellurides. Sulfides and selenides have a pronounced tendency to form amorphous solids. They are therefore preferably used for the fabrication of CBRAM cells. Oxides can likewise be formed as amorphous layers, but their structure (microstructure) is generally so dense that the ionic mobility of the metallic component is too low. Sulfides and in particular selenides have a more open microstructure and are therefore preferred from the perspective of switching speed in CBRAM cells.

Germanium from main group IV of the Periodic System can be used as the more electropositive chemical element in the chalcogenide compounds. These IV-VI compounds, as they are known, are suitable as amorphous matrices for CBRAM memory cells; germanium sulfide and germanium selenide represent preferred IV-VI compounds for use as amorphous matrices in the CBRAM memory cells. Alternatively, however, silicon selenide or silicon sulfide are also suitable as amorphous matrices for CBRAM memory cells.

The selenium or sulfur content in germanium selenide $Ge_xSe_{1-x}$ and germanium sulfide $Ge_xS_{1-x}$ may vary over a wide range. Particularly suitable glasses with ideal properties are formed if x is in the range from 0.2 to 0.5 and is, for example, 0.33. Generally, x must have a value which is such that the corresponding selenide or sulfide can easily be formed into a stable glass that is suitable for solid ion conduction. In the description which follows below, all selenide and sulfide glasses are hereinafter referred to as Ge—S and Ge—Se chalcogenide compounds, irrespective of the particular value of x.

In the amorphous matrix which forms the active material of the CRAM memory cell, the metal which is contained, under the influence of an electric field, forms cations which migrate through the amorphous matrix to the cathode under the influence of this field. Particularly suitable metals are silver (Ag) and copper (Cu), with silver being preferred, since it is easy to ionize and in the ionized state (as Ag+) has the required mobility in the amorphous matrix of the chalcogenide glass. The quantity of silver which can be taken up by Ge—Se and Ge—S compounds depends on the Ge/S or Ge/Se quantitative ratio. This saturation concentration is typically a few 10 s of atomic percent, for example $Ge_{0.3}Se_{0.7}$ is 47.3 atomic percent of silver.

The cathode is typically composed of an inert material, such as molybdenum or tungsten. The cathode may also be composed of tantalum, titanium, such as conductive oxides, nitrides, or highly n-doped or highly p-doped silicon or alloys of the abovementioned materials. As used herein, the term "inert material" means a conductive material which, under the influence of an electric field, conducts the current but does not form cations, or its cations, when an electric field is applied and has no mobility or only an insignificant mobility within the amorphous matrix.

A metal or a chemical compound whose cations are suitable for ion migration through the solid electrolyte is used as the anode. The anode is preferably composed of the metal which is also contained in the solid electrolyte. As result, the quantity of metal which is electrochemically deposited at the cathode can be topped up by the oxidation of the anode. It is therefore preferable to use an anode made from copper, silver or silver compounds, such as for example $Ag_2S$, $Ag_2Se$.

In the processes used hitherto for fabricating CBRAM memory cells, solid electrolytes, such as the preferred Ge—Se—Ag glasses and Ge—S—Ag glasses, have been formed by photolytic dissolution (photodiffusion) of silver in a thin film of the solid electrolyte. One drawback of these fabrication methods is that the photolytic dissolution of silver is carried out in a separate process step, generally by UV exposure, such as by mercury vapor lamps, so that in this step it is necessary for the wafers to be discharged from the vacuum chamber and then reintroduced into the vacuum chamber for further processing following the photodiffusion. As a result of this process step, there is a very high risk of contamination of the wafer and/or of the wafer being covered with foreign particles.

SUMMARY OF THE INVENTION

The present invention provides a method for fabricating CBRAM memory cells, in which the separate process step of photodiffusion is eliminated altogether.

In accordance with the present invention, a method for fabricating a resistively switching memory cell comprises depositing a first electrode, applying a layer of a chalcogenide compound to the first electrode, applying a metallic doping layer of silver or copper in a first noble gas plasma to the layer of the deposited chalcogenide compound, and applying a silver-copper diffusion from the applied metallic doping layer into the layer of the chalcogenide compound in a second noble gas plasma and via a back-sputtering process.

The above and still further objects, features and advantages of the present invention will become apparent upon consideration of the following detailed description of specific embodiments thereof, particularly when taken in conjunction with the accompanying drawing.

BRIEF DESCRIPTION OF THE DRAWINGS

The sole FIGURE diagrammatically depicts a Ag/xenon plasma diffusion process in accordance with the present invention.

DETAILED DESCRIPTION

The invention provides a method for fabricating a resistively switching memory cell, where the method includes depositing a first electrode, applying a layer of a chalcogenide compound to the first electrode, applying a metallic doping layer of silver or copper in a first noble gas plasma to the layer of the deposited chalcogenide compound, and applying a silver-copper diffusion from the applied metallic doping layer into the layer of the chalcogenide compound in a second noble gas plasma and via a back-sputtering process.

An important feature of the invention is the elimination of the conventional separate photodiffusion step by UV exposure of the Ag layer. This is made possible by the sputtered-on Ag doping layer being made to diffuse into, e.g., a GeSe matrix layer by a xenon plasma in the coating installation. Then, the top electrode is deposited without the wafer having to be discharged from the installation or intermediate venting of the installation having to be carried out. Xenon is a particularly suitable gas for the plasma, because this noble gas makes it possible to generate very intensive UV radiation in the gas discharge. However, other noble gases can also be used. Thus, in accordance with the present invention, the conventional separate UV exposure step for the photodiffusion is replaced by photodiffusion via a plasma radiation step under a vacuum.

It is known that gas discharges generate excited gas atoms or ions which emit UV radiation as they drop back into the original state inter alia. The intensity of the UV radiation component with which the substrate is irradiated depends first on the excitation and ionization level of the gas atoms used (generally noble gases) and on the concentration of the ions and excited neutral atoms. The UV dose with which the Ag doping layer is irradiated is equal to the product of the UV power density and the radiation duration. To this extent, the plasma photodiffusion process according to the invention can be controlled reproducibly by the plasma parameters and vacuum pressure and duration.

The noble gas argon which is most frequently used for the sputtering decomposition process and is also used for the sputtering of the GeSe matrix layer and for the silver doping layer and the top electrode, also emits radiation in the UV wavelength region. However, xenon is far superior to argon in terms of the efficiency and dose of emission of UV radiation in the gas discharge.

Therefore, in accordance with the present invention, it is provided that after the sputtering of the Ag doping layer, a xenon plasma be used for the photodiffusion in back-sputtering mode, in which the substrate is exposed to a negative voltage.

The advantage of the method according to the invention is based on the one hand on the cost savings, on account of the fact that the wafer no longer has to be discharged from the vacuum chamber for the external photodiffusion and then introduced back into the vacuum chamber. Further, the possibility of contamination or of the wafer being covered with foreign particles is suppressed by virtue of the fact that following the xenon plasma diffusion the fabrication of the memory cell can be continued with the deposition of the top electrode in principle simply by pumping out xenon and admitting argon to the coating installation. In addition to these two primary improvements, it is also possible, by increasing the negative bias voltage on the substrate, to set the layer thickness of the Ag doping layer in a defined way down to the sub-nano range, by virtue of the fact that the Ag layer can be removed again in a few atomic layer doses. This makes it possible to set the Ag doping concentration in a very defined way.

It is preferable for the step of operating a noble gas plasma to be carried out in a back-sputtering mode, maintaining the following parameters: Pressure: $4 \times 10^{-3}$ mbar to $10 \times 10^{-3}$ mbar; Duration: 5 minutes to 10 minutes; Substrate bias: about −200V to about −400V.

According to a preferred embodiment, the second electrode includes copper or silver or silver alloy which is dissolved in the amorphous matrix of the solid electrolyte and is involved in the switching effect. Silver or an alloy or a chemical compound of silver, such as $Ag_2S$, $Ag_2Se$ is particularly preferred. According to the invention, the amorphous or partially amorphous matrix is particularly advantageously saturated with silver. The saturation concentration is a few 10 s of atomic percent and, for example, for the $Ge_{0.3}Se_{0.7}$ which can be used according to the invention is 47.3 atomic percent of silver.

However, the second electrode can also include materials such as, for example, Pt, Pd, Al, Ti or TiN. In this case, a doping layer containing copper and/or silver is arranged between the second electrode and the solid electrolyte.

In another embodiment of the invention, the second electrode can include a plurality of layers of different materials. In this embodiment, at least one layer, namely the layer which is in contact with the solid electrolyte, is composed of copper, silver or a silver compound or silver alloy.

The first electrode (i.e. the cathode during the electrochemical switching from the high-resistance state to the low-resistance state) of the resistively switching memory cells according to the invention preferably includes molybdenum, tungsten, Ta, Ti, conductive oxides, conductive nitrides or highly n-doped or highly p-doped silicon.

According to another embodiment of the invention, the amorphous matrix or the glass of the solid electrolyte includes a germanium sulfide compound or a germanium selenide compound.

The layer of the solid electrolyte can be applied to the electrode of the CBRAM memory cell by layer deposition methods, such as PVD, CVD (chemical vapor deposition), ALD (atomic layer deposition), PLD (pulsed laser deposition), and co-evaporation. It is preferable to use processes which can be used for the well-controlled deposition of thin films and in which low deposition temperatures are used, for example ALD, MF-DC or HF sputtering.

A description of an exemplary method of the present invention is now described with reference to the sole FIGURE. In a first method step, a first electrode composed of tungsten is deposited on a substrate by evaporation coating or by CVD. This electrode is inert and is therefore not involved in the electrochemical processes in the finished CBRAM memory cell. The material for the first electrode is introduced into a previously etched hole and then planarized by CMP (chemical mechanical polishing). Subsequently, the first electrode produced in this way is coated with a dielectric and a hole is etched through this dielectric, so that the chalcogenide material which is subsequently deposited is in direct electrical contact with the electrode layer. The chalcogenide material shown in the FIGURE is preferably composed of GeSe. The chalcogenide material can be deposited by PVD, CVD or ALD processes. After the Ag doping layer has been applied by sputtering in an Ar atmosphere, the photodiffusion of the Ag doping layer takes place by a xenon plasma which is generated in a back-sputtering mode (negative voltage at the substrate). The voltage used in the FIGURE is about −400 V. The structure produced in this way is then completed by deposition of the second electrode in a sputtering process.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

What is claimed:

1. A method for fabricating a resistively switching memory cell, the method comprising the following sequential steps:
   depositing a first electrode;
   applying a layer comprising a chalcogenide compound to the first electrode;
   applying on the layer of the chalcogenide compound a metallic doping layer comprising one of silver and copper in an argon gas plasma; and then
   performing an additional step of diffusion of the metal from the doping layer into the layer of the chalcogenide compound through a back-sputtering process in a xenon gas plasma.

2. The method of claim 1, further comprising depositing a second electrode comprising at least one layer of copper, silver and a silver alloy.

3. The method of claim 2, wherein the second electrode consists of silver.

4. The method of claim 1, wherein the chalcogenide compound comprises one of a binary germanium sulfide compound, a germanium selenide compound and a ternary or quaternary composition made up of Ge, Si, Se and S.

5. The method of claim 4, wherein the germanium sulfide compound has the formula $Ge_xS_{1-x}$, the germanium selenide compound has the formula $Ge_xSe_{1-x}$, and x has a value from 0.2 to 0.5.

6. The method of claim 5, wherein x is 0.33.

7. The method of claim 1, wherein the first electrode comprises an electrically conductive, inert material.

8. The method of claim 7, wherein the first electrode consists of a material selected from the group consisting of tungsten, molybdenum, tantalum, titanium, conductive oxides, conductive nitrides, highly doped n-typed silicon compounds, highly doped p-type silicon compounds, and combinations thereof.

9. The method of claim 8, wherein the first electrode consists of tungsten.

10. The method of claim 1, wherein a voltage applied to the substrate in the back-sputtering process is within a range from about −200V to about −400V.

11. The method of claim 10, wherein the voltage applied to the substrate in the back-sputtering process is about −400V.

12. The method of claim 1, wherein a vacuum used in the back-sputtering process is within a range from $4 \times 10^{-3}$ mbar to $10 \times 10^{-3}$ mbar.

13. The method of claim 1, wherein the back-sputtering process is performed for a period of time lasting from 5 minutes to 10 minutes.

14. A method for fabricating a resistive memory, the method comprising:
   depositing a first electrode;
   depositing a resistivity changing material contacting the first electrode;
   depositing a metallic doping material comprising one of silver and copper in a noble gas plasma over the resistivity changing material; and
   performing a diffusion of the metallic, doping material into the resistivity changing material via a back-sputtering process in a xenon gas plasma.

15. The method of claim 14, further comprising depositing a second electrode comprising at least one of copper, silver, and a silver alloy over the resistivity changing material.

16. The method of claim 14, wherein a voltage applied to the substrate in the back-sputtering process is within a range from −200V to −400V.

17. The method of claim 14, wherein the first electrode comprises an electrically conductive and inert material.

18. The method of claim 14, wherein the back-sputtering process is performed for a period lasting from 5 minutes to 10 minutes.

19. The method of claim 14, wherein depositing the resistivity changing material comprises depositing a chalcogenide compound.

20. A method for fabricating a resistively switching memory, the method comprising:
   depositing a first electrode comprising an electrically conductive and inert material;
   applying a layer comprising a chalcogenide compound to the first electrode;
   applying a metallic doping layer comprising one of silver and copper in an argon gas plasma to the layer of the chalcogenide compound;
   performing a diffusion of the metal from the doping layer into the layer of the chalcogenide compound through a back-sputtering process in a xenon gas plasma; and
   depositing a second electrode comprising at least one of copper, silver, and a silver alloy over the chalcogenide compound.

* * * * *